(12) United States Patent
Kubo

(10) Patent No.: US 7,837,301 B2
(45) Date of Patent: Nov. 23, 2010

(54) PRINTED BOARD FOR INK JET HEAD

(75) Inventor: Tomoyuki Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 382 days.

(21) Appl. No.: 11/475,865

(22) Filed: Jun. 28, 2006

(65) Prior Publication Data
US 2007/0000974 A1 Jan. 4, 2007

(30) Foreign Application Priority Data
Jun. 30, 2005 (JP) ............... 2005-192367

(51) Int. Cl.
B41J 2/16 (2006.01)
B23K 31/02 (2006.01)
(52) U.S. Cl. .................. 347/50; 228/180.21
(58) Field of Classification Search .......... 347/50, 347/58, 68; 228/180.21; 361/212
See application file for complete search history.

(56) References Cited
U.S. PATENT DOCUMENTS

| 4,878,070 | A | * | 10/1989 | Watrobski | ............ 347/58 |
| 5,315,472 | A | * | 5/1994 | Fong et al. | ............ 361/212 |
| 5,610,642 | A | * | 3/1997 | Nobel et al. | ............ 347/50 |
| 5,748,209 | A | * | 5/1998 | Chapman et al. | ............ 347/50 |
| 6,402,299 | B1 | * | 6/2002 | DeMeerleer et al. | ............ 347/50 |
| 6,652,072 | B2 | * | 11/2003 | Browning et al. | ............ 347/50 |
| 2002/0180686 | A1 | | 12/2002 | Yuda et al. | |
| 2003/0112298 | A1 | * | 6/2003 | Sato et al. | ............ 347/68 |
| 2004/0060969 | A1 | | 4/2004 | Imai et al. | |
| 2005/0179747 | A1 | | 8/2005 | Iamai et al. | |
| 2005/0270339 | A1 | * | 12/2005 | Sugahara | ............ 347/68 |
| 2006/0203040 | A1 | | 9/2006 | Imai et al. | |

FOREIGN PATENT DOCUMENTS

| JP | 2003-050402 | | 2/2003 |
| JP | 2003-069103 | | 3/2003 |
| JP | 2004-114609 | | 4/2004 |
| JP | 2004114609 | | 4/2004 |
| JP | 2004-319692 | | 11/2004 |
| JP | 2005-161760 | | 6/2005 |
| JP | 2005161760 | * | 6/2005 |
| WO | WO98/52762 | * | 11/1998 |

OTHER PUBLICATIONS

Japan Patent Office; Office Action in Japanese Patent Application No. 2005-192367 (counterpart to the above-captioned US Patent Application) maiiled on Sep. 14, 2010.

* cited by examiner

Primary Examiner—Manish S Shah
Assistant Examiner—Carlos A Martinez, Jr.
(74) Attorney, Agent, or Firm—Baker Botts, LLP.

(57) ABSTRACT

When the driving printed wires from the drive IC are passed between the terminal lands and connected to respective terminal lands, and the printed wires of a number greater than the number of printed wires that can be passed between the terminal lands are required, the driving printed wires from the drive IC are led on the outer side of the columns of the plurality of terminal lands and connected to respective terminal lands.

8 Claims, 7 Drawing Sheets

F I G. 2
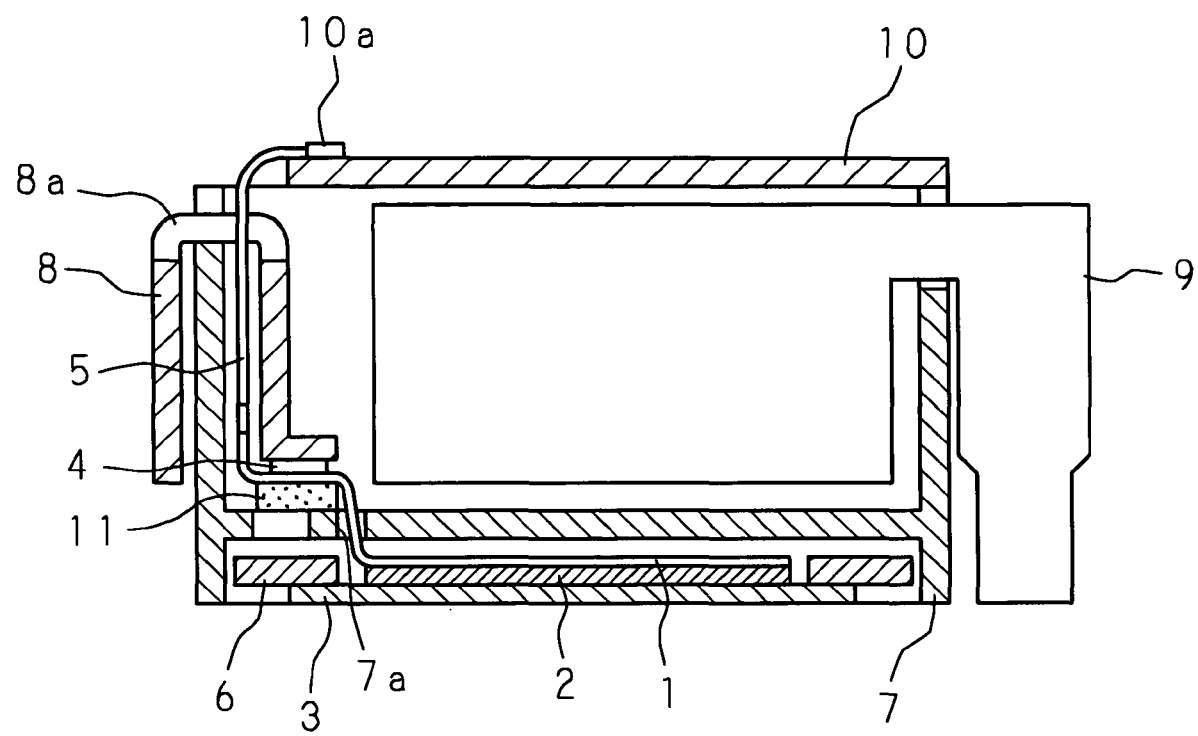

PRINTED BOARD FOR INK JET HEAD

CROSS-REFERENCE TO RELATED APPLICATIONS

This non-provisional application claims priority under 35 U.S.C. §119(a) on Patent Application No. 2005-192367 filed in Japan on Jun. 30, 2005, the entire contents of which are hereby incorporated by reference.

BACKGROUND

The present invention relates to a printed board arranged with a plurality of printed wires which transmit a driving voltage from a drive IC to a plurality of individual terminals which are provided on a piezoelectric element of an ink jet printer in correspondence to ink discharge ports, and are applied with the driving voltage when generating pressure to discharge the ink, and also relates to an ink jet head equipped with the printed board.

In the ink jet printer, color printing is performed using a plurality of ink cartridges such as cyan, magenta, yellow, black and the like. The ink supplied from a plurality of ink cartridges is discharged from a plurality of discharge ports formed in the ink jet head by the pressure generated by the piezoelectric element.

The piezoelectric element includes a plurality of individual terminals, in correspondence to the plurality of ink discharge ports, to be applied with the driving voltage, and driving voltage is supplied from the drive IC to each individual terminal via the flexible printed board connected to the piezoelectric element. There are advantages that the degree of freedom of mounting when mounting the ink jet head to the ink jet printer can be increased and that the ink jet printer can be miniaturized by using the flexible printed board for the transmission of the driving voltage, control signal and the like. In recent years, COF (Chip On Film) in which the drive IC is directly mounted on the flexible printed board is put to practical use, COF thus allows the distance from the drive IC to the piezoelectric element to be shorter, thereby reducing attenuation, delay and the like of the driving voltage and efficiently driving the piezoelectric element.

In the connecting configuration of the flexible printed board disclosed in Japanese Patent Application Laid-Open No. 2004-114609, columns of a plurality of terminal lands are arranged adjacent to each other in a zigzag manner on a band shaped insulating body, and through holes are formed in the insulating body in correspondence to the arrangement position of the terminal lands. Each terminal land is thus exposed from the opposite surface of the insulating body, and connected to the terminal of the piezoelectric element by arranging a solder on the exposed terminal land. The plurality of terminal lands are arranged at high density by arranging the columns of the terminal lands adjacent to each other in a zigzag manner. Further, the printed wire from the drive IC to the terminal land is passed between the terminal lands, led to the corresponding terminal land, and connected to each terminal land so as to avoid the other terminal lands.

SUMMARY

In recent years, the number of discharge ports for discharging the ink is increasing and the density in the arrangement of the plurality of discharge ports is becoming higher for the ink jet printer as one method of enhancing the quality of printing. When the discharge ports are at high density, the arrangement of the terminal lands of the flexible printed board must correspondingly be at high density.

In the connecting configuration of the flexible printed board disclosed in Japanese Patent Application Laid-Open No. 2004-114609, the printed wires from the drive IC are passed between the terminal lands and connected to the corresponding terminal lands. However, the distance between the columns of the terminal lands, and, the distance between the terminal lands adjacent to each other in the column of the terminal lands become shorter due to higher density of arrangement of the terminal lands. Thus, the limit in the number of printed wires that can be passed between the terminal lands lowers, which limit is becoming smaller than the number of printed wires that must be passed between the terminal lands. Therefore, there is no space to lead the printed wires from the driving IC to the corresponding terminal lands even when attempting to further increase the number of discharge ports of the ink to enhance the quality of printing. There is a problem that the printed wires may be arranged on both surfaces of the flexible printed board to counter such a problem, but in such case, the manufacturing step becomes complicating, and the cost of the flexible printed board increases.

In view of the above, it is therefore an object to provide a printed board capable of increasing the number of terminal lands to greater than or equal to a limit, even if the number of printed wires that can be passed between the terminal lands is limited, that is, increasing the number of discharge ports of the ink.

It is also an object to provide an ink jet head including ink discharge ports and terminal lands corresponding to the ink discharge ports arranged at high density, and in which a force acting to strip the connecting portion is less likely to be applied with respect to the electrical connecting portion of the terminal lands and the printed board for supplying a signal to each terminal land.

A printed board according to a first aspect is a printed board comprising: an insulating film; a plurality of terminal lands forming a plurality of columns and arranged adjacent to each other at one end portion of one surface of the insulating film; and a plurality of printed wires arranged on one surface of the insulating film and connected to the corresponding plurality of terminal lands respectively; wherein the plurality of printed wires includes: a plurality of printed wires arranged extending to the corresponding terminal lands in a direction intersecting an extending direction of the terminal land columns formed by the plurality of terminal lands and passed between the plurality of terminal lands; and a plurality of printed wires arranged extending in a direction intersecting the extending direction on an outer side of the plurality of terminal land columns.

In the first aspect, the printed wires other than the printed wires that can be passed between the terminal lands of the printed wires from the drive IC are led on the outer side of the columns of a plurality of terminal lands, and connected to the corresponding terminal lands. Thus, the total number of printed wires that must be passed between the terminal lands is maintained to less than or equal to the number of printed wires that can be passed between the terminal lands irrespective of the total number of printed wires.

An ink jet head according to a second aspect is an ink jet head comprising: a flow channel unit including a plurality of discharge ports for discharging ink and a plurality of pressure chambers each communicated to the plurality of discharge ports, the plurality of pressure chambers being arranged in a plurality of columns on one surface; an actuator unit, that includes a plurality of connecting terminals arranged at positions corresponding to the pressure chambers and that is fixed to one surface of the flow channel unit, for changing the volume in the pressure chambers; a driving element for outputting a driving voltage to supply to the connecting terminals of the actuator unit; and a printed board interposed between the actuator unit and the driving element, and including a plurality of printed wires for supplying the driving voltage to the connecting terminals, wherein the printed board is a printed board as described above, the connecting terminals corresponding to the terminal lands are respectively connected to the terminal lands; the driving element is connected to the plurality of printed wires on the side opposite the side on which the actuator unit is connected with respect to a direction intersecting the extending direction of the terminal land columns; and the dimension of the printed board in the extending direction of the terminal land columns is smaller than the dimension of the actuator unit connected to the printed board.

In the second aspect, the actuator unit and the drive IC are connected with a printed board having a dimension smaller than the actuator unit. Thus, when the printed board arranged with the terminal lands and the printed wires at high density is stacked and connected to the actuator unit, the region surrounded by the end parts of three sides other than the pull-out side of the printed board is positioned on the actuator.

According to the first aspect, the printed wires from the drive IC are passed between the terminal lands, forming a plurality of columns and arranged adjacent to each other, and connected to respective terminal lands, and the printed wires from the drive IC are circumvented on the outer side of the columns of the plurality of terminal lands and connected to respective terminal lands, so that the number of terminal lands can be increased without being limited to the number of printed wires that can be passed between the terminal lands. Further, since the terminal lands are arranged at high density, a great number of ink discharge ports are arranged at high density, thereby allowing a high quality printing to be performed.

According to the second aspect, by connecting the piezoelectric element for generating the pressure to discharge the ink and the driving element for driving the piezoelectric element by means of a printed board arranged with the terminal lands at high density, a greater number of ink discharge ports of the ink jet head can be arranged, and thus high quality printing of the ink jet printer is performed. Further, by having the dimension of the printed board smaller than the dimension of the actuator unit, the external force acting to strip the connection can be less likely to be directly applied thereto if the actuator unit and the printed board are connected by way of solder. Thus, the rate of occurrence of the connection failure of the actuator unit and the printed board is reduced, and yield is enhanced. Moreover, it contributes to reduction of the cost of the ink jet head itself.

The above and further objects and features will more fully be apparent from the following detailed description with accompanying drawings.

BRIEF DESCRIPTION OF THE SEVERAL VIEWS OF THE DRAWINGS

FIG. 2 is a side cross sectional view showing a configuration of the ink jet head;

DETAILED DESCRIPTION OF THE EXEMPLARY EMBODIMENTS

Figure 1:
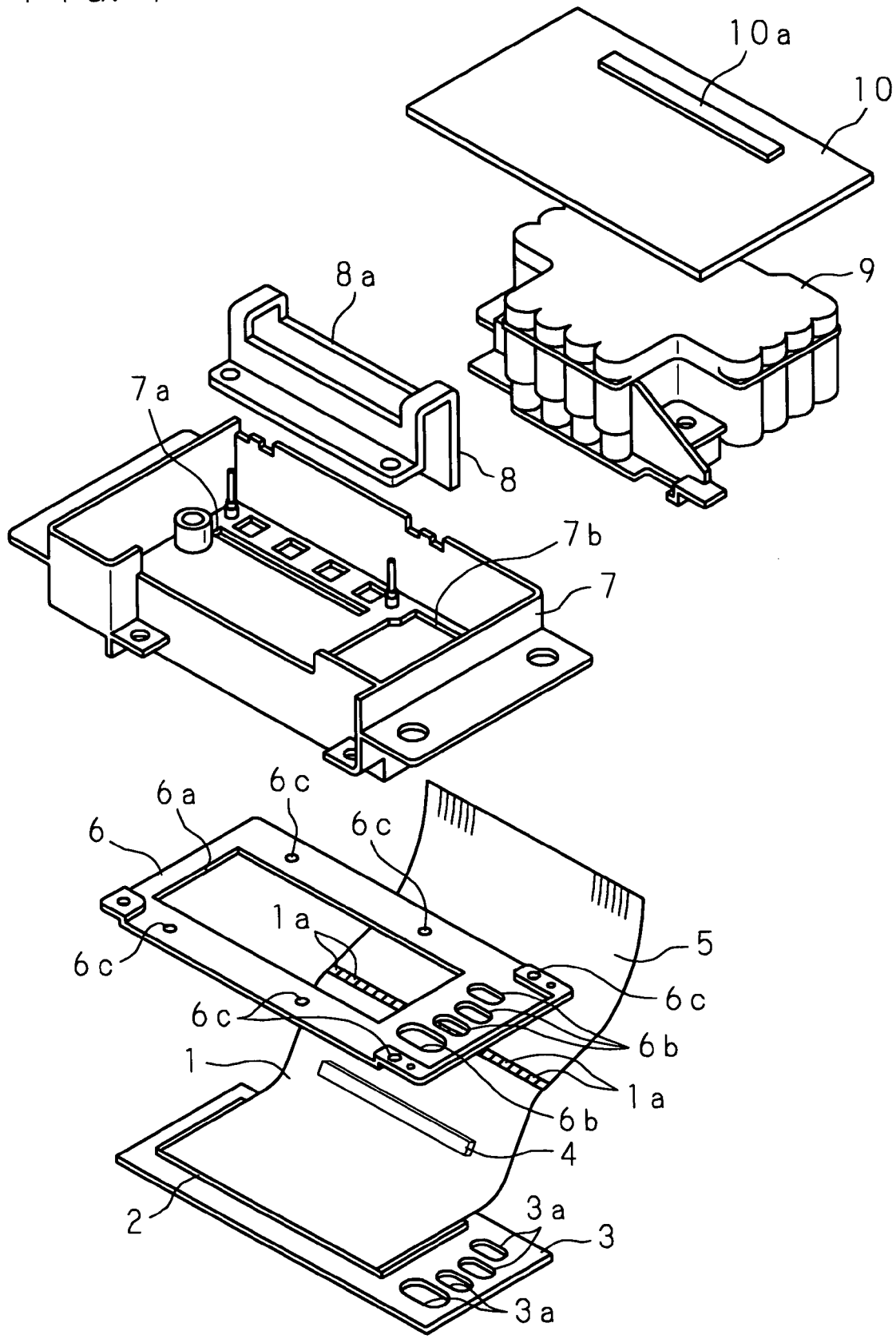
FIG. 1 is an exploded perspective view showing a configuration of an ink jet head.

The embodiments will now be specifically described based on the drawings. FIG. 1 is an exploded view showing a configuration of an ink jet head, and FIG. 2 is a side cross sectional view showing a configuration of the ink jet head.

As shown in FIG. 1 and FIG. 2, the ink jet head includes a flow channel unit 3, arranged facing the recording medium, for discharging the ink. The flow channel unit 3 has a substantially rectangular outer shape, and is configured by stacking a plurality of metal plates, which are each formed with a through hole of a different shape, on a resin nozzle plate formed with a plurality of ink discharge ports. The through holes of the plurality of metal plates are continued one above the other to form a space constituting the ink flow channel and the ink pressure chamber and the like in the flow channel unit 3. The ink flow channel is arranged for every ink of each color of cyan, magenta, yellow, and black and the ink pressure chamber is arranged on the upper side of the flow channel unit 3 for each discharge port. Four ink supply ports $3a$, $3a$, ... for supplying the ink to each ink flow channel are arranged adjacent to each other on the upper surface of the flow channel unit 3 along the short side of the flow channel unit 3 on one end side in the longitudinal direction. When the ink is supplied from the ink supply ports $3a$, $3a$, ... the ink is distributed to the ink pressure chamber through the ink flow channel, and the ink is discharged from the ink discharge ports on the lower surface of the flow channel unit 3.

A piezoelectric element 2 (actuator unit) for applying discharge pressure to the ink in each ink pressure chamber is adhered to the upper surface of the flow channel unit 3 with an adhesive. The piezoelectric element 2 has a substantially rectangular plate shape smaller than the flow channel unit 3, and is adhered along the longitudinal direction of the flow channel unit 3 close to the short side not provided with the ink supply ports $3a$, $3a$, .... The piezoelectric element 2 is configured by stacking a plurality of ceramic plates of $PbTiO_3$—$PbZrO_3$ and the like. A plurality of individual terminals (connecting terminal) are arranged adjacent to each other in a plurality of columns in correspondence to each ink pressure chamber at the upper surface of the piezoelectric element 2, and a plurality of common terminals connected to ground potential are arranged surrounding the periphery of the plurality of individual terminals. A driving voltage for deforming the piezoelectric element 2 and applying discharge pressure to the ink is applied through the individual terminal.

A film shaped flexible printed board 1 including a plurality of printed wires is connected to the upper surface of the piezoelectric element 2 by way of the solder. The solder connects the individual terminal and the common terminal of the piezoelectric element 2 to the plurality of terminal lands arranged on the flexible printed board 1. The flexible printed board 1 has a substantially rectangular outer shape, the length of which short side thereof is slightly shorter than the length of the long side of the piezoelectric element 2. As shown in FIG. 1, the piezoelectric element 2 is connected on one short side of the flexible printed board 1. A plurality of connecting terminals 1a, 1a, . . . for connecting a flat cable 5 for relaying the printed wire is arranged along the short side on the edge portion on the other short side of the flexible printed board 1. Further, the drive IC 4 (driving element) for generating the driving voltage to drive the piezoelectric element 2 is soldered at an intermediate position between the piezoelectric element 2 and the connecting terminal 1a, 1a, . . . on the surface opposite the surface connected with the piezoelectric element 2, of the flexible printed board 1.

The drive IC 4 interiorly includes a plurality of drive circuits corresponding to the number of the ink discharge ports arranged in the flow channel unit 3. Each drive circuit supplies the driving voltage of about 15V to 30V to each individual terminal of the piezoelectric element 2 through the printed wire formed in the flexible printed board 1. The piezoelectric element 2 supplied with the driving voltage displaces and generates the pressure for discharging the ink in the corresponding ink pressure chamber.

The flat cable 5 is a substantially rectangular film shape, and has one end side connected to the connecting terminal 1a, 1a, . . . of the flexible printed board 1, and the other end side connected to a connector 10a of the circuit board 10 mounted with a control circuit of the ink jet printer. The flat cable 5 includes a plurality of printed wires arranged inside with both ends connected, and relays a plurality of control signals for operating the drive IC 4, as well as the power for the logic circuit operation and the driving voltage and the like from the circuit board 10. That is, the signals and power are transmitted to the drive IC 4 mounted on the flexible printed board 1 through the flat cable 5.

Further, in addition to the piezoelectric element 2, a reinforcing frame 6 having a substantially rectangular plate shape greater than the flow channel unit 3 and formed with a substantially rectangular opening 6a greater than the piezoelectric element 2 is adhered to the upper surface of the flow channel unit 3 with an adhesive. The reinforcing frame 6 is a member that surrounds the periphery of the piezoelectric element 2 and reinforces the flow channel unit 3. The reinforcing frame 6 is formed with four through holes 6b, 6b, . . . at positions corresponding to the ink supply ports 3a, 3a, . . . of the flow channel unit 3. The reinforcing frame 6 further includes a plurality of screw holes 6c, 6c, . . . arranged adjacent to each other along both long sides. The piezoelectric element 2 and the flexible printed board 1 are exposed on the upper side of the reinforcing frame 6 through the opening 6a of the reinforcing frame 6.

The above explained flow channel unit 3, the piezoelectric element 2, the flexible printed board 1, and the reinforcing frame 6 are respectively connected by an adhesive, a solder or the like to configure an integrated stacked body. The stacked body is screw-fixed to the lower surface of a holder 7 made of resin using screw holes 6c, 6c, . . . of the reinforcing frame 6. Further, the holder 7 has a substantially cuboid shape with the upper surface opened, and accommodates the ink buffer tank 9 inside. The slit 7a is formed at the lower surface of the holder 7. As shown in FIG. 2, the flexible printed board 1 and the flat cable 5 are pulled out from the bottom (lower surface side) of the holder 7 through the slit 7a. That is, the flexible printed board 1 and the flat cable 5 are pulled out from the slit 7a so as to be bent upward substantially perpendicularly between the piezoelectric element 2 and the drive IC 4, and then pulled out upward by again being bent perpendicularly at the portion after the position at which the drive IC 4 is mounted.

A heat sink 8 for releasing heat from the drive IC 4 is arranged across one side wall of the holder 7. The heat sink 8 is a rectangular metal plate curved into a substantially inverted U-shape, and has one end bent substantially perpendicularly towards the outside. The bent portion of the heat sink 8 is positioned on the inner side of the holder 7, and is contacted to the drive IC 4. The width of the heat sink 8 in the direction along the side wall of the holder 7 is greater than the length of the short side of the flexible printed board 1 and the flat cable 5, and a cut-out 8a having a width of about the same extent as the length of the short side of the flexible printed board 1 and the flat cable 5 is formed at the upper part (curved portion) of the heat sink 8.

A cushion member 11 made of rubber (only shown in FIG. 2) having a substantially cuboid shape in which the length is about the same as the length of the short side of the flexible printed board 1 is arranged facing the lower surface of the bent portion of the heat sink 8 on the bottom surface of the holder 7. The flexible printed board 1 and the drive IC 4 are sandwiched by the bent portion of the heat sink 8 and the cushion member 11. Thus, the heat generated through the operation of the drive IC 4 is radiated to the outside of the holder 7 through the heat sink 8.

The flexible printed board 1 is bent upward substantially perpendicularly between the drive IC 4 and the connecting terminals 1a, 1a, . . . . The flat cable 5 connected to the connecting terminals 1a, 1a, . . . runs upward through the gap formed by the side wall of the holder 7 and the heat sink 8, reaching the upper side of the holder 7 through the cut-out 8a of the heat sink 8.

The ink of each color is supplied through the ink supply tube (not shown) from the four ink cartridges each accommodating the ink of cyan, magenta, yellow and black to the ink buffer tank 9 accommodated in the holder 7. The supplied ink is temporarily stored in the ink buffer tank 9, and then supplied to the flow channel unit 3. One through hole 7b of a substantially rectangular shape having a size of surrounding the four through holes 6b, 6b, . . . is formed on the bottom surface of the holder 7 in correspondence to the positions of the ink supply ports 3a, 3a, . . . of the flow channel unit 3 and the through holes 6b, 6b, . . . of the reinforcing frame 6. The ink buffer tank 9 at the upper side space of the bottom surface of the holder 7 and the reinforcing frame 6 at the lower side space of the bottom surface are joined through the through hole 7b. Thus, the ink in the ink buffer tank 9 can be supplied to the flow channel unit 3 through the through holes 6b, 6b, . . . of the reinforcing frame 6 and the ink supply ports 3a, 3a, . . . of the flow channel unit 3.

The circuit board 10 covers the upper surface of the ink buffer tank 9 at the upper part of the holder 7 accommodating the ink buffer tank 9. In the present embodiment, the circuit board 10 constitutes the lid of the holder 7. The flat cable 5 passed through the cut-out 8a of the heat sink 8 and pulled out to the upper part of the holder 7 is connected to the connector 10a arranged at the upper surface of the circuit board 10. The circuit board 10 and the flexible printed board 1 are thereby electrically connected.

Figure 3:
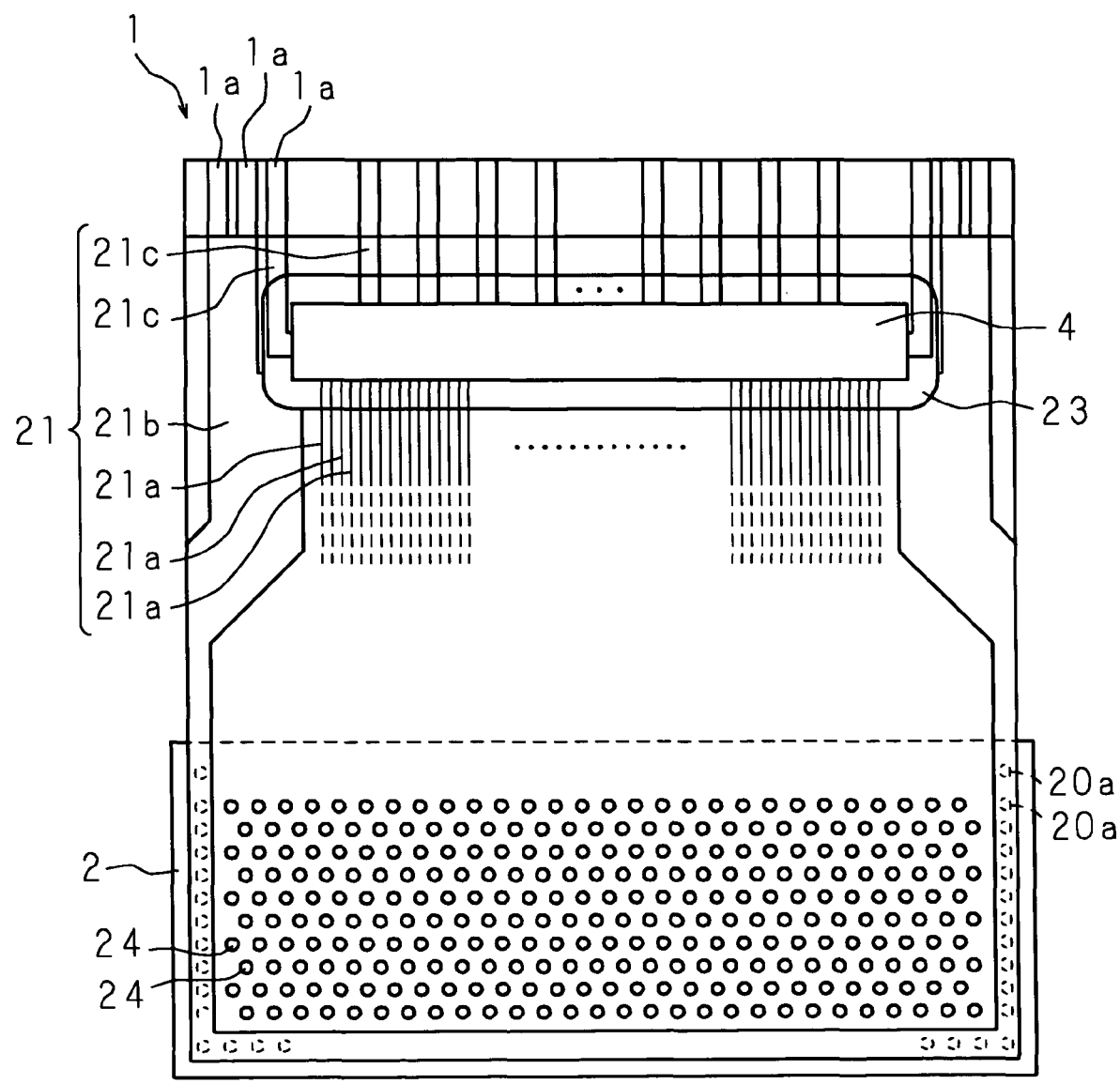
FIG. 3 is a plane view showing a configuration of a flexible printed board.
Figure 4:
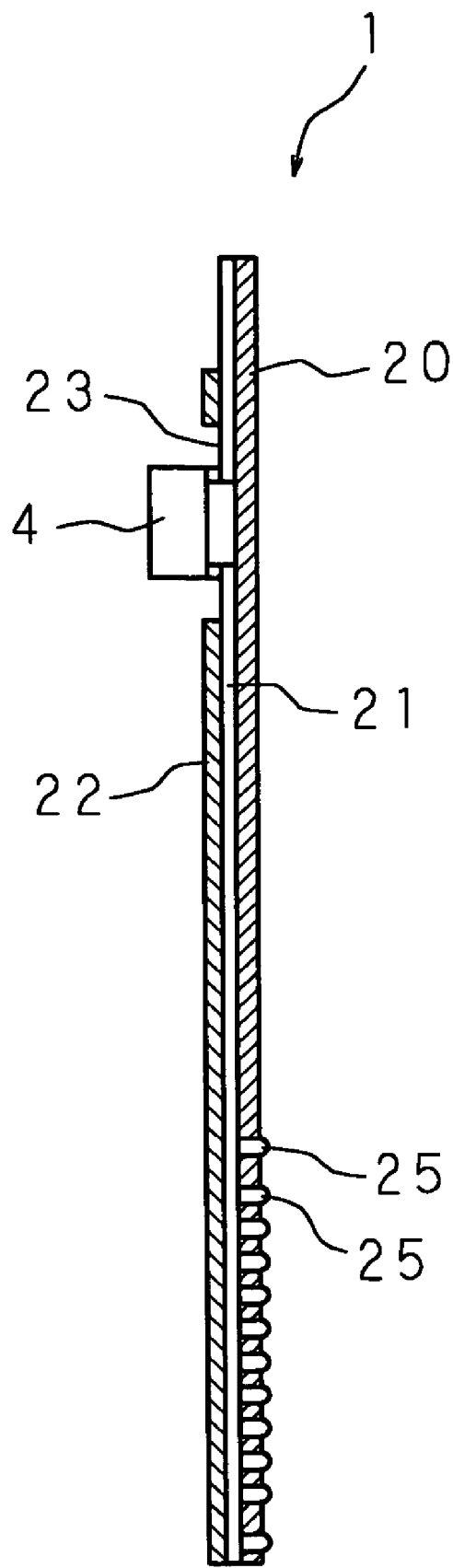
FIG. 4 is a schematic cross sectional view showing a configuration of the flexible printed board.

FIG. 3 is a plan view showing a configuration of the flexible printed board 1, wherein the surface connected with the drive IC 4 is shown. FIG. 4 is a schematic cross sectional view showing a configuration of the flexible printed board 1, wherein the cross section in the longitudinal direction of the flexible printed board 1 is shown.

The flexible printed board 1 is a flexible printed board made of synthetic resin such as polyimide resin or polyester resin, and mainly includes a substantially rectangular insulating film 20 and a plurality of printed wires 21 arranged on one surface of the insulating film 20. The printed wire 21 includes driving voltage printed wires 21a, 21a, . . . (hereinafter referred to as driving printed wire) for transmitting the driving voltage from the drive IC 4; a ground potential printed wire 21*b* (hereinafter referred to as ground printed wire) for supplying the ground potential through one of the connecting terminals 1*a*, 1*a*, . . . connecting to the flat cable 5; and signal printed wires 21*c*, 21*c*, . . . for transmitting the signal from the connecting terminals 1*a*, 1*a*, . . . to the drive IC 4, and is formed by a metal such as copper or aluminum. Further, an insulating film 22 made of synthetic resin is formed so as to cover the plurality of printed wires 21. The drive IC 4 is soldered to the driving printed wires 21*a*, 21*a*, . . . and the signal printed wires 21*c*, 21*c*, . . . exposed at the IC connecting part 23 which is the portion not covered by the insulating film 22, of one surface of the insulating film 20.

The ground printed wire 21*b* is a wide width printed wire having a line width of about a few mm to more than ten mm, and has a width of an extent that does not arise lack of power supply even if the driving voltage is simultaneously applied to a plurality of individual terminals. The ground printed wire 21*b* surrounds the periphery of the insulating film 20 excluding the short side portion where the connecting terminals 1*a*, 1*a*, . . . are arranged adjacent to each other. That is, both ends of the ground printed wire 21*b* are connected to the connecting terminals 1*a*, 1*a*, . . . positioned on both ends, of the plurality of the connecting terminals 1*a*, 1*a*, . . . . The plurality of signal printed wires 21*c*, 21*c*, . . . are arranged extending in the longitudinal direction of the insulating film 20 from each connecting terminal 1*a*, 1*a*, . . . to the IC connecting part 23, and is connected to the corresponding connecting terminal (not shown) of the drive IC 4 with the solder.

The driving printed wire 21*a*, 21*a*, . . . is a microscopic printed wire having a line width of about 20 μm, and is arranged extending in the longitudinal direction of the insulating film 20 from the IC connecting part 23 to the side opposite the connecting terminals 1*a*, 1*a*, . . . . A few hundred driving printed wires 21*a*, 21*a*, . . . are arranged adjacent to each other at an interval of about 20 μm at the region arranged with the driving printed wire 21*a*, 21*a*, . . . , as shown in FIG. 3. Each driving printed wire 21*a*, 21*a* has one end connected to the corresponding connecting terminal of the drive IC 4, and the other end connected to one of a plurality of terminal lands 24, 24, . . . for attaching the solder.

Each terminal land 24, 24, . . . has a substantially circular shape having a diameter of about 150 μm. As shown in FIG. 3, 28 terminal lands 24, 24, . . . are arranged in one column in the direction of the short side of the insulating film 20. Further, 10 columns of terminal lands 24, 24, . . . are arranged parallel to each other so that each terminal land 24, 24, . . . is arranged in a zigzag manner in the direction of the long side of the insulating film 20. In the present embodiment, the distance between the columns of the terminal lands 24, 24, . . . , is a distance that allows about 14 driving printed wires 21*a*, 21*a*, . . . to pass through and the distance between the terminal lands 24, 24, . . . in the column is a distance that allows about 7 driving printed wires 21*a*, 21*a*, . . . to pass through.

The through holes 20*a*, 20*a*, . . . (refer to FIGS. 5, 6, 7) are coaxially perforated in the insulating film 20 in correspondence to the position at which each terminal land 24, 24, . . . is arranged. The through hole 20*a*, 20*a* . . . has a substantially circular shape smaller than the terminal land 24, 24, . . . . One portion of the terminal lands 24, 24, . . . is exposed from the through holes 20*a*, 20*a*, . . . at the opposite surface of the insulating film 20. The solder is attached to the exposed portion of the terminal lands 24, 24, . . . and solder bumps 25, 25, . . . are formed. The through holes 20*a*, 20*a*, . . . of the same size are similarly perforated at the portion at which the ground printed wire 21*b* is arranged (refer to FIG. 5), and the solder bumps 25, 25, . . . for ground potential are formed.

As explained above, the connecting terminals 1*a*, 1*a*, . . . connected with the flat cable 5; the signal printed wires 21*c*, 21*c*, . . . extending from the connecting terminal 1*a*, 1*a*, . . . and ending at the IC connecting part 23; the driving printed wires 21*a*, 21*a*, . . . extending from the IC connecting part 23 and ending at the terminal land 24, 24, . . . ; the ground printed wire 21*b* having both ends connected to the connecting terminal 1*a*, 1*a*, . . . and surrounding each of the printed wires; and a plurality of terminal lands 24, 24, . . . are formed on the upper surface of the flexible printed board 1, as shown in FIG. 3. The ground printed wire 21*b* is arranged along the peripheral edge portion of the insulating film 20. Further, the insulating film 22 covers the upper surface of the flexible printed board 1 leaving the connecting terminals 1*a*, 1*a*, . . . and the IC connecting part 23. The drive IC 4 is mounted on the IC connecting part 23 exposed from the insulating film 22 with the solder so as to connect the signal printed wires 21*c*, 21*c*, . . . and the driving printed wires 21*a*, 21*a*, . . . .

Further, the solder bumps 25, 25, . . . attached to the terminal lands 24, 24, . . . and the ground printed wire 21*b* are formed projecting at substantially the same height to pass through the insulating film 20, as shown in FIG. 4. Thus, multiple solder bumps 25, 25, . . . positioned in correspondence to the terminal lands 24, 24, . . . and multiple solder bumps 25, 25, . . . attached to the ground printed wire 21*b* so as to surround the above from three sides are lined on the lower surface of the flexible printed board 1.

The arrangement region of the solder bumps 25, 25, . . . is faced to the piezoelectric element 2 to be stacked, as shown in FIG. 3. The end part region of the flexible printed board 1 including such arrangement region is also facing to the piezoelectric element 2 excluding the pull-out side of the flexible printed board 1. That is, when seen in plan view, the piezoelectric element 2 positioned at the lower layer is exposed from the flexible printed board 1 in three sides other than the pull-out side of the flexible printed board 1. Thus, after the flexible printed board 1 and the piezoelectric element 2 are joined, the force acting so as to strip each connecting portion is less likely to be directly applied thereon by the solder bump 25, 25, . . . .

Figure 5:
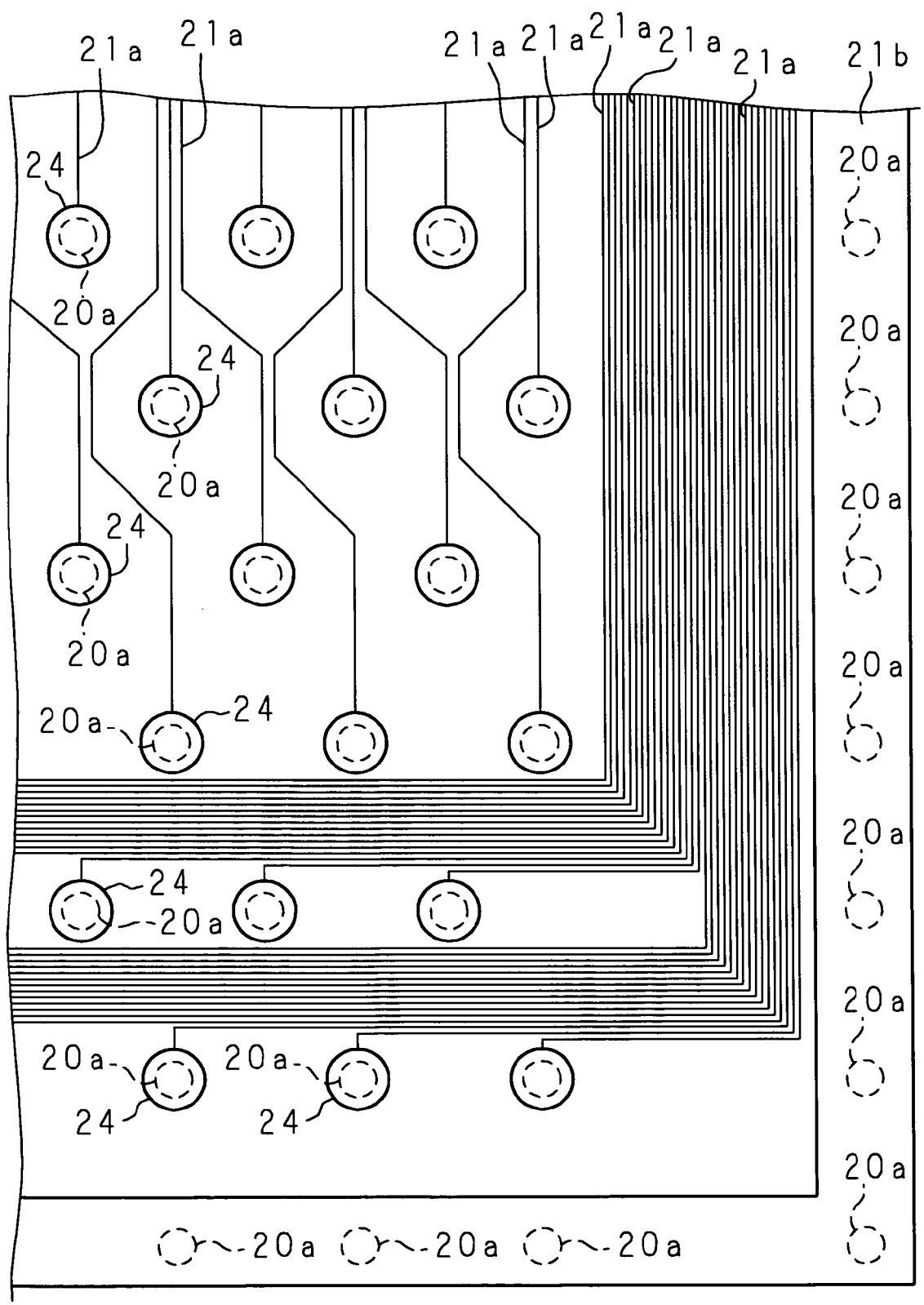
FIG. 5 is an enlarged plan view showing a configuration of the flexible printed board.

FIG. 5 is an enlarged plan view showing a configuration of the flexible printed board 1, wherein the lower right portion of the flexible printed board 1 shown in FIG. 3 is shown in an enlarged state. In FIG. 5, two types of driving printed wires 21*a*, 21*a*, . . . which are on the inner side of the ground printed wire 21*b* and which are differently led are shown in addition to the ground printed wire 21*b* arranged on the peripheral edge portion of the insulating film 20.

Respective terminal lands 24, 24, . . . form a terminal land column of 10 columns parallel to each other in accordance with the arrangement state of the individual terminal on the piezoelectric element 2, as described above. Each column is arranged parallel to the longitudinal direction (direction of the short side of the insulating film 20) of the substantially rectangular drive IC 4. First, of the plurality of driving printed wires 21*a*, 21*a*, . . . , the driving printed wires 21*a*, 21*a*, . . . connecting to the terminal lands 24, 24, . . . on the first to the eighth columns from the side of the drive IC 4 are passed between the terminal lands 24, 24, . . . adjacent to each other, and connected to the respectively corresponding terminal land 24, 24, . . . from the drive IC 4. These driving printed wires 21*a*, 21*a*, . . . correspond to the printed wires connecting to the terminal lands 24, 24, . . . on the third and subsequent columns from the bottom in FIG. 5. As apparent from FIG. 5, all of the driving printed wires 21*a*, 21*a* . . . meander in a fine manner, but traverse the more upper terminal land columns substantially perpendicularly. In the present embodiment, the driving printed wires 21a, 21a, . . . are pulled out to the side on which the drive IC 4 is arranged, traversing the arrangement region of the terminal lands 24, 24, . . . on the third or subsequent columns from the bottom in FIG. 5.

The driving printed wires 21a, 21a, . . . connecting to the terminal lands 24, 24, . . . of the ninth and the tenth columns (first column and second column from the bottom in FIG. 5) from the side of the drive IC 4 pass through a space between the outer side of the columns of the terminal lands 24, 24, . . . and the ground printed wire 21b, and extend to the end of the column of the terminal lands 24, 24, . . . on the ninth and the tenth column in the longitudinal direction of the flexible printed board 1. Further, they pass between the eighth and the ninth columns as well as between the ninth and the tenth columns and connect to the respectively corresponding terminal lands 24, 24, . . . of the ninth and the tenth columns. That is, the driving printed wires 21a, 21a, . . . extend substantially linearly from the IC connecting part 23 along the outer side of the arrangement region of the terminal lands 24, 24, . . . on the third to subsequent columns from the bottom in FIG. 5. Further, the driving printed wires 21a, 21a, . . . are bent when reaching the vicinity of the opening between the columns of the corresponding terminal lands, and extended in the direction of the short side of the insulating film 20 in the gap between the columns.

As shown in FIG. 3, the flexible printed board 1 has a substantially symmetrical form with the center in the longitudinal direction of the insulating film 20 as the border, and the opposite side in the column direction of the column of the terminal lands 24, 24, . . . also has a similar printed wire configuration. In the present embodiment, about 14 printed wires can be passed between the columns of the terminal lands 24, 24, . . . . The driving printed wires 21a, 21a, . . . are arranged from both sides of the column for one gap between the columns, so that the number of printed wires passing between the columns is doubled. Herein, one column of the terminal lands are configured by 28 (=14×2) terminal lands 24, 24, . . . .That is, by passing 28 driving printed wires 21a, 21a, . . . each on both outer sides of the column of the terminal lands 24, 24, . . . , the driving printed wires 21a, 21a, . . . from the drive IC 4 can be connected to terminal lands 24, 24, . . . on the ninth and the tenth columns each arranged with 28 terminal lands 24, 24, . . . adjacent to each other.

As described above, by combining the driving printed wires 21a, 21a, . . . passing between the terminal lands 24, 24, . . . and the driving printed wires 21a, 21a, . . . passing on the outer side of the terminal land column, a plurality of driving printed wires 21a, 21a, . . . can be arranged at high degree of freedom without interfering with each other. Thus, higher resolution and higher density of the ink jet head can be achieved with a compact form without trouble.

Figure 6:
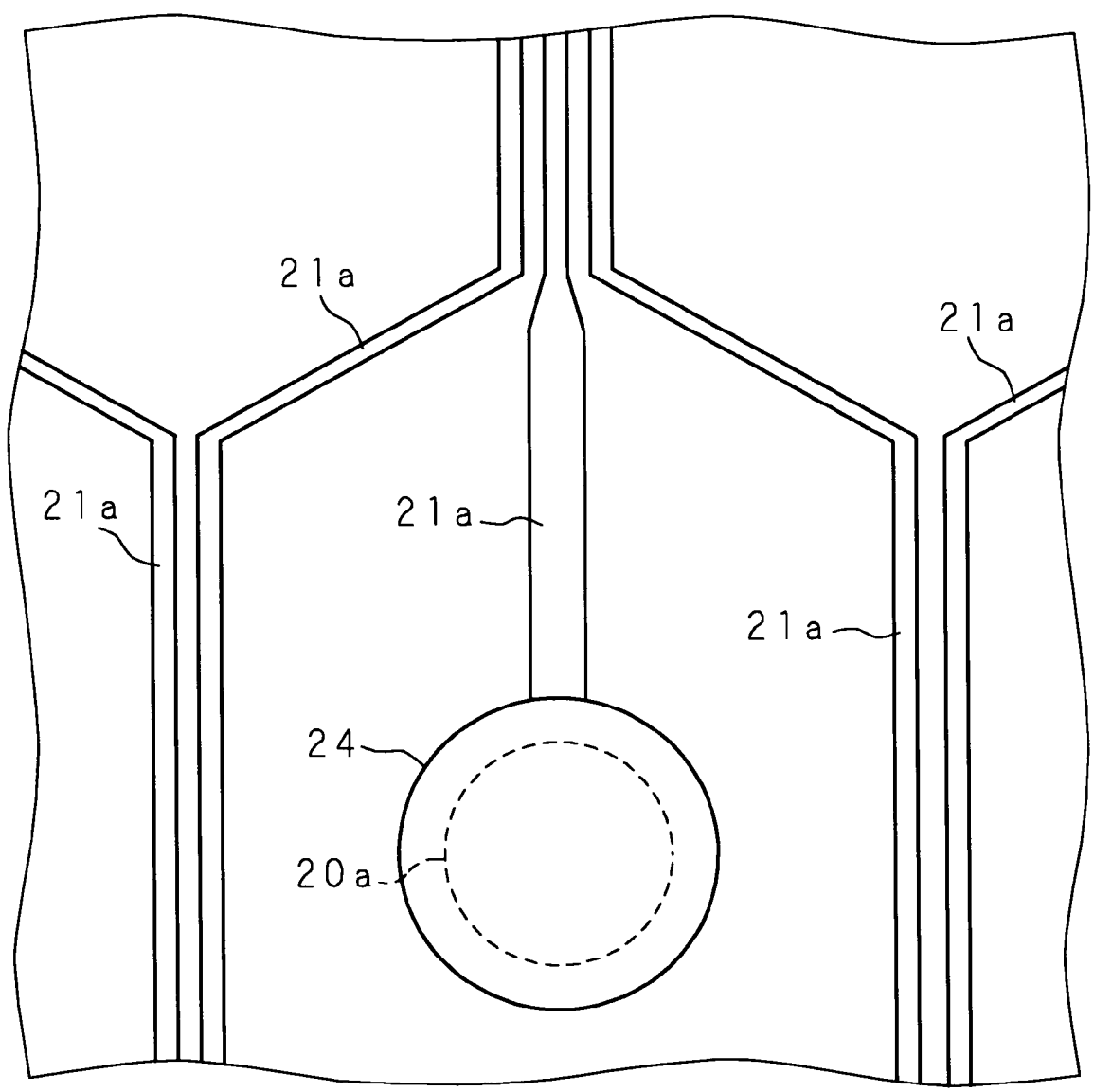
FIG. 6 is an enlarged plan view of FIG. 5.

FIG. 6 is an enlarged plan view of FIG. 5, where the vicinity of one terminal land 24 in the column of the terminal lands 24, 24, . . . in the sixth column from the side on which the drive IC 4 is arranged is enlarged as one example. The driving printed wire 21a, 21a, . . . connecting to the terminal land 24, 24, . . . has a portion ranging from the portion connecting to the terminal land 24, 24, to the portion at which a plurality of driving printed wires 21a, 21a, . . . are arranged adjacent to each other, made wider than the other portions. The driving printed wires 21a, 21a, . . . lead so as to intersect a few columns are respectively connected to the terminal lands 24, 24, . . . in the first to the eighth columns counting from the drive IC 4. The driving printed wires 21a, 21a, . . . circumvent to avoid all the terminal lands other than the corresponding terminal land 24. Thus, a space wider than the other space is formed at a space on the drive IC 4 side for all of the terminal lands 24, 24, . . . . The width of the driving printed wire 21a, 21a, . . . is thereby made wider than the other portion in such empty space. For the terminal lands 24, 24, . . . on the first to the eighth columns, the number of driving printed wires 21a, 21a, . . . passing between the terminal lands 24, 24, . . . is lessened as the distance from the drive IC 4 becomes larger. The empty space at the periphery of the terminal lands 24, 24, . . . therefore becomes wider by such amount, and the length is made longer with the width maintained wide for the driving printed wires 21a, 21a, . . . connecting to the terminal lands 24, 24, . . . distant from the drive IC 4.

Since the driving printed wire 21a, 21a . . . is a microscopic printed wire and has the risk of breaking, the printed wire width is made wide at where the empty space is large in the vicinity of the terminal lands 24, 24, . . . , so that breakage is less likely to occur.

Figure 7:
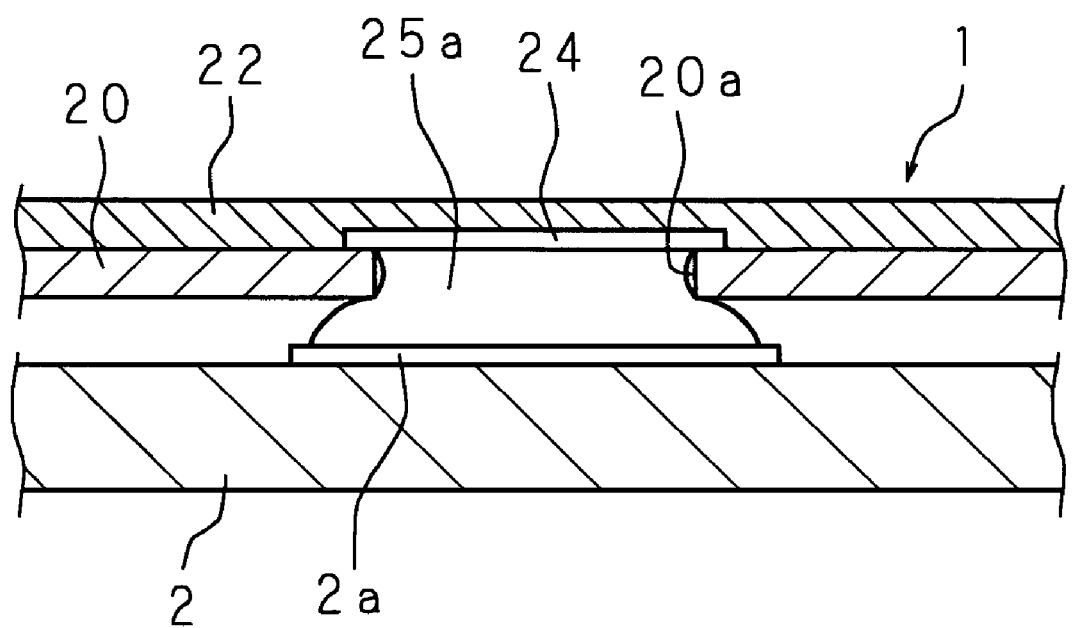
FIG. 7 is an enlarged cross sectional view showing a configuration of a connecting portion of the flexible printed board and the piezoelectric element.

FIG. 7 is an enlarged cross sectional view showing a configuration of a connecting portion of the flexible printed board 1 and the piezoelectric element 2, where one of the plurality of terminal lands 24, 24, . . . of the flexible printed board 1 is shown in an enlarged state.

A through hole 20a is perforated in the insulating film 20 in correspondence to the arrangement position of the terminal land 24 of the flexible printed board 1. The solder 25a (electrically conductive brazing filler metal) is attached to one portion of the terminal land 24 exposed from the through hole 20a to form the solder bump 25 (refer to FIG. 4). The solder bump 25 of the flexible printed board 1 and the individual terminal 2a of the piezoelectric element 2 are faced to each other, and the flexible printed board 1 is heated, thereby melting the solder bump 25, so that the terminal land 24 and the individual terminal 2a are connected by way of the solder 25a. Here, since the insulating film 20 that rejects the melted solder is interposed between the adjacent solder bumps 25, the solders 25a which are melted and have higher fluidity do not connect with each other.

In the ink jet head of the above configuration, the terminal lands 24, 24, . . . on the eight column are the limit for connecting to the drive IC 4 since only seven printed wires can be passed between the terminal lands 24, 24, . . . if the driving printed wires 21a, 21a, . . . are passed only between the terminal lands 24, 24, . . . . However, the driving printed wires 21a, 21a, . . . from the drive IC 4 can be connected to the terminal lands 24, 24, . . . on the ninth and the tenth columns by passing the driving printed wire 21a, 21a, . . . on the outer side of the column of the terminal lands 24, 24, . . . . The number of terminals 24, 24, . . . can be increased to the eleventh column, the twelfth column, and more with a similar configuration. Further, the number of ink discharge ports of the ink jet head may be increased in correspondence to the terminal lands 24, 24, . . . , thereby allowing a higher quality printing to be performed.

In the present embodiment, a configuration in which the flexible printed board 1 is arranged with ten columns, each column being arranged with 28 terminal lands 24, 24, . . . adjacent to each other is shown, but is not limited thereto, and may be a configuration of including terminal lands of greater than or equal to 28, or less than or equal to 28. Further, a configuration in which the terminal lands 24, 24, . . . are arranged in a zigzag manner is shown, but is not limited thereto, and may be arranged in a lattice form. Further, a configuration in which the distance between the columns of the terminal lands 24, 24, . . . is all the same distance is shown, but is not limited thereto.

A configuration in which the driving printed wires 21a, 21a, ... are passed on both outer sides of the column of the terminal lands 24, 24, ... is shown, but is not limited thereto, and may be a configuration in which the printed wires are passed on only one side. The configuration may be such that the driving printed wires 21a, 21a, ... passed on the outer side of the column of the terminal lands 24, 24, ... are passed between the column of the terminal lands 24, 24, ... of the tenth column and the ground printed wire 21b, and connected to terminal lands 24, 24, ... of the tenth column respectively.

In the embodiment explained above, the through hole 20a is formed at a portion facing the terminal land 24 with respect to the insulating film 20 serving as a base material of each printed wire, and one part of the terminal land 24 is exposed on the surface opposite the surface arranged with the printed wire, but is not limited thereto. In terms of preventing short circuit between the terminal lands 24 (solder bumps 25), the previously explained insulating film 22 may include a through hole corresponding to the through hole 20a of the insulating film 20. That is, the through hole may be formed at a position facing each terminal land 24 in addition to the IC connecting part 23 when covering one surface (surface arranged with printed wire) of the insulating film 20 with the insulating film 22. Thus, the through hole 20a does not need to be formed in the insulating film 20 as a separate step, which contributes to reduction of cost of the flexible printed board 1. The thermal curing resin or photo curing resin such as urethane, epoxy, polyimide and the like may be used for the insulating film 22. The photo curing resin is suitably used in terms of precision of the shape. In this case, the heat sink 8 is arranged so as to contact the drive IC 4 by way of the flexible printed board 1.

In the present embodiment, when increasing the number of terminal lands, the terminal lands are arranged on the side distant from the drive IC, and the printed wires from the drive IC are passed through the end side of the columns of the terminal lands and connected to the terminal lands on the side distant from the drive IC. The printed wire to the terminal land on the side close to the drive IC is the same as in the prior art. Thus, when leading each printed wire, the interference between the printed wires having different leading direction with respect to each other is avoided.

In the present embodiment, a plurality of terminal lands are arranged in a zigzag manner. The distance between the adjacent terminal lands is thus made larger considering the percentage of the area occupied by each terminal land.

In the present embodiment, the width of the printed wire connecting to the terminal land is made thick near the terminal land and made thin at the portion distant from the terminal land. Thus, with regards to the printed wire led between the terminal land and the drive IC, the mechanical strength at least near the terminal land is enhanced.

In the present embodiment, the printed wires from the outer side of the column of the terminal lands are passed between the columns of the terminal lands and connected to terminal lands respectively. However, if the total number of printed wires on both outer sides is an even number, the same number of printed wires is arranged on both outer sides, and if the total number of printed wires is an odd number, the difference in the number of printed wires arranged on each outer side is one. Thus, the number of printed wires that can be led between the common columns is substantially doubled.

In the present embodiment, the through hole is formed in the insulating body in correspondence to the arrangement position of the terminal land and the electrically conductive brazing filler metal is arranged on the terminal land exposed on the opposite surface of the insulating body by the through hole, the electrically conductive brazing filler metal allowing the connection between the terminal of the piezoelectric element and the terminal land of the printed board. The electrically conductive brazing filler metals that may cause short circuit with each other is spaced apart by the insulating body at the opposite surface of the insulating body, and the printed wire and the terminal land arranged on the other surface are spaced apart by the insulating body.

According to the present embodiment, with a configuration of connecting the printed wires passing the outer side of the columns of the plurality of terminal lands to the terminal lands arranged on the side distant from the drive IC in addition to the configuration of passing the printed wires between the terminal lands when the printed wires from the drive IC to the terminal lands are arranged so as to intersect the column direction of the terminal land column, the printed wires having a different printed wire arrangement can be led without interfering with each other, and can be arranged compactly and without any trouble within the limited region of the printed board.

According to the present embodiment, high quality printing can be performed since the terminal lands are arranged at high density by arranging the plurality of terminal lands in a zigzag manner.

According to the present embodiment, the width of the printed wire connecting to the terminal land is made thick near the terminal land and made thin at the portion distant from the terminal land, so that the empty space in the vicinity of the terminal land is effectively used, and the strength of printed wire is enhanced. Thus, the rate of occurrence of defects by breakage is reduced, and yield is enhanced.

According to the present embodiment, a greater number of printed wires can be arranged by arranging a plurality of printed wires on each outer side of the columns of the plurality of terminal lands. Thus, a greater number of terminal lands, that is, a greater number of ink jet discharge ports can be arranged, thereby allowing a higher quality printing to be performed. Also, the same number of printed wires are arranged on both outer sides if the total number of printed wires on both outer sides is an even number, and the difference in the number of printed wires arranged on each outer side is one if the total number of printed wires is an odd number, thereby greatest number of printed wires can be led between the columns of the terminal land column. That is, when connecting the printed wires from both outer sides to the terminal lands on the column distant from the drive IC, the printed wires can be efficiently led from both outer sides to each terminal land, and thus enlargement of the printed board is suppressed, and increase in cost of the printed board can be suppressed.

According to the present embodiment, a through hole is formed in the insulating body in correspondence to the arrangement position of the terminal land, the terminal land is exposed on the opposite surface of the insulating body, and the electrically conductive material is arranged on the exposed terminal land to connect with the terminal of the piezoelectric element, so that the electrically conductive brazing filler metals arranged at the adjacent terminal lands do not contact and cause short circuit even if the terminal lands are arranged at high density. Further, short circuit does not occur with the adjacent printed wires. Thus, defects are less likely to occur at the step of connecting the printed board and the piezoelectric element, and the yield is enhanced.

As this description may be embodied in several forms without departing from the spirit of essential characteristics thereof, this embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A printed board comprising:
   an insulating film;
   a plurality of terminal lands forming a plurality of columns and arranged adjacent to each other at one end portion of one surface of the insulating film;
   a plurality of printed wires arranged on one surface of the insulating film, wherein each of the plurality of printed wires is connected to at least one of the plurality of terminal lands, wherein the plurality of printed wires comprises:
      a first plurality of printed wires arranged extending to the corresponding terminal lands in a direction intersecting an extending direction of the terminal land columns formed by the plurality of terminal lands and the first plurality of printed wires pass between the plurality of terminal lands; and
      a second plurality of printed wires arranged extending in a direction intersecting the extending direction on an outer side of the plurality of terminal land columns; and
   a ground printed wire arranged on the one surface of the insulating film, wherein the ground printed wire is positioned on the outer side of the plurality of printed wires at three peripheral sides of the end portion of the insulating film and the ground printed wire connects with at least one solder bump through at least one through hole formed in the insulating film at each of the three peripheral sides of the ground printed wire,
   wherein the first plurality of printed wires at least are connected to each of the terminal lands arranged in a first plurality of columns of the plurality of terminal lands and the second plurality of printed wires at least are connected to each of the terminal lands arranged in at least one second column of the plurality of terminal lands, wherein the first plurality of columns are positioned farther from an edge of the insulating film at the one end portion side than the at least one second column is positioned from the edge of the insulating film at the one end portion side.

2. The printed board according to claim 1, wherein the plurality of terminal lands are arranged in a zigzag manner.

3. The printed board according to claim 1, wherein a line width of the printed wire is formed to be narrower as the distance from the corresponding terminal land becomes larger.

4. The printed board according to claim 1, wherein the plurality of printed wires are arranged extending on both outer sides in the extending direction of the plurality of terminal land columns; and the difference between the number of printed wires arranged on one side and the number of printed wires arranged on the other side is less than or equal to 1.

5. The printed board according to claim 1, further comprising:
   a plurality of through holes, each perforated at an arrangement position of the terminal land of the insulating film, for exposing one part of the terminal land on the other surface of the insulating film; and
   an electrically conductive brazing filler metal attached to the terminal land by way of the through hole.

6. The printed board according to claim 1, wherein a width of the ground printed wire is greater than a width of the plurality of printed wires.

7. The printed board according to claim 1, wherein the second plurality of printed wires are connected to each of the terminal lands arranged in at least one third column of the plurality of terminal lands, wherein the first plurality of columns are positioned farther from an edge of the insulating film at the one end portion side than each of the at least one second column and the at least one third column are positioned from the edge of the insulating film at the one end portion side.

8. An ink jet head comprising:
   a flow channel unit including a plurality of discharge ports for discharging ink and a plurality of pressure chambers each communicated to the plurality of discharge ports, the plurality of pressure chambers being arranged in a plurality of pressure chamber columns on one surface;
   an actuator unit, that includes a plurality of connecting terminals arranged at positions corresponding to the pressure chambers and that is fixed to one surface of the flow channel unit, for changing the volume in the pressure chambers;
   a driving element for outputting a driving voltage to supply to the connecting terminals of the actuator unit; and
   a printed board interposed between the actuator unit and the driving element, and including a plurality of printed wires for supplying the driving voltage to the connecting terminals,
   wherein
   the printed board is a printed board according to claim 1, the connecting terminals corresponding to the terminal lands are respectively connected to the terminal lands;
   the driving element is connected to the plurality of printed wires on the side opposite the side on which the actuator unit is connected with respect to a direction intersecting the extending direction of the terminal land columns; and
   the dimension of the printed board in the extending direction of the terminal land columns is smaller than the dimension of the actuator unit connected to the printed board.

* * * * *